(12) United States Patent
Chen et al.

(10) Patent No.: US 12,127,371 B2
(45) Date of Patent: Oct. 22, 2024

(54) SINGLE-PHASE IMMERSION COOLING SYSTEM

(71) Applicant: META Green Cooling technology Co., Ltd., Taoyuan (TW)

(72) Inventors: Keng-Han Chen, Taipei (TW); Chia-Chien Chu, Taipei (TW)

(73) Assignee: META Green Cooling technology Co., Ltd., Taoyuan (TW)

( * ) Notice: Subject to any disclaimer, the term of this patent is extended or adjusted under 35 U.S.C. 154(b) by 232 days.

(21) Appl. No.: 17/868,813

(22) Filed: Jul. 20, 2022

(65) Prior Publication Data
US 2023/0413473 A1 Dec. 21, 2023

(30) Foreign Application Priority Data
Jun. 16, 2022 (TW) .................................. 111206341

(51) Int. Cl.
 *H05K 7/20* (2006.01)
(52) U.S. Cl.
 CPC ..... *H05K 7/20236* (2013.01); *H05K 7/20272* (2013.01); *H05K 7/20781* (2013.01)
(58) Field of Classification Search
 CPC ............. H05K 7/20781; H05K 7/2079; H05K 7/20772; H05K 7/20236
 See application file for complete search history.

(56) References Cited

U.S. PATENT DOCUMENTS

| | | | |
|---|---|---|---|
| 2009/0100848 A1* | 4/2009 | Kuriyama | F28F 17/005 62/132 |
| 2013/0208421 A1* | 8/2013 | Chester | F25D 23/12 165/104.31 |
| 2014/0238065 A1* | 8/2014 | Bonnin | H05K 7/20218 62/259.2 |
| 2017/0347498 A1* | 11/2017 | Janak | H05K 7/1488 |
| 2018/0098464 A1* | 4/2018 | Ishinabe | H05K 7/20736 |
| 2020/0275584 A1* | 8/2020 | Chiang | H05K 7/20772 |
| 2021/0103320 A1* | 4/2021 | Saito | G05D 7/0676 |
| 2021/0385978 A1* | 12/2021 | Shao | H05K 7/1489 |
| 2022/0346283 A1* | 10/2022 | Himmelhuber | H05K 7/20781 |
| 2022/0354022 A1* | 11/2022 | Chen | H05K 7/20663 |
| 2023/0042343 A1* | 2/2023 | Hashimoto | H05K 7/20272 |
| 2023/0189476 A1* | 6/2023 | Wu | H05K 7/20263 361/699 |

\* cited by examiner

Primary Examiner — Tho V Duong

(57) ABSTRACT

A single-phase immersion cooling system includes a cabinet, circulation pipeline, driving mechanism and cooling mechanism. The cabinet has therein a partition board for partitioning a space into an immersion tank and cooling space. The circulation pipeline includes an input segment, output segment and cooling segment. The input and output segments penetrate the partition board. The cooling segment is disposed in the cooling space and is in communication with the input and output segments. The driving mechanism is disposed at the cooling segment. The cooling mechanism is disposed on one side of the cabinet and positioned proximate to the cooling space. A ventilation opening in communication with the cooling space is formed on at least one lateral side of the cabinet. The single-phase immersion cooling system operates independently without connecting to any external cooling tower or chiller, so it is easier to install and move this system.

8 Claims, 5 Drawing Sheets

SINGLE-PHASE IMMERSION COOLING SYSTEM

CROSS-REFERENCE TO RELATED APPLICATION

This non-provisional application claims priority under 35 U.S.C. § 119(a) on Patent Application No(s). 111206341 filed in Taiwan, R.O.C. on Jun. 16, 2022, the entire contents of which are hereby incorporated by reference.

BACKGROUND OF THE INVENTION

1. Field of the Invention

The present application relates to cooling systems, and in particular to a single-phase immersion cooling system.

2. Description of the Related Art

A cooling system is a type of common mechanical equipment in the industrial sector. In general, an electronic device, for example a host computer and a server, generates a large amount of heat during operation; thus, unless the heat is dissipated or the electronic device is cooled, the electronic device will end up with deteriorated computation performance or even a failure. Therefore, it is important to dissipate heat from the electronic device efficiently.

Removal of heat from an electronic device with a cooling liquid has the advantages of speedy heat transfer, quick convection and high specific heat capacity and further evolved into immersion cooling systems. The immersion cooling systems each store a large amount of cooling liquid once and have an electronic device immersed in the cooling liquid to quickly transfer heat away from the electronic device and dispense with a process of designing local water passages. Therefore, the immersion cooling systems are popular with the industrial sector.

However, the cooling liquid which has absorbed the heat from the electronic device has to be delivered to a cooling system, such as an external cooling tower or chiller, in order to be cooled down and fed to the immersion tank again. The cooling system has to be connected to an external pipeline; as a result, the cooling system is difficult to install, immovable and impossible to be self-contained.

BRIEF SUMMARY OF THE INVENTION

In view of the aforesaid drawbacks of the conventional immersion cooling system, it is an objective of the application to provide a self-contained single-phase immersion cooling system.

In order to achieve the above and other objectives, the application provides a single-phase immersion cooling system, comprising: a cabinet having therein a partition board for partitioning a space into an immersion tank and a cooling space; a circulation pipeline comprising an input segment, an output segment and a cooling segment, with the partition board being penetrated by the input segment and the output segment, and with the cooling segment being disposed in the cooling space and in communication with the input segment and the output segment; a driving mechanism disposed at the cooling segment; and a cooling mechanism disposed on a side of the cabinet and positioned proximate to the cooling space, wherein a ventilation opening in communication with the cooling space is formed on at least one lateral side of the cabinet.

In an embodiment of the application, the input segment comprises a main pipe and a branch pipe, the main pipe penetrating the partition board, the branch pipe being in communication with the main pipe and branching out, with a plurality of discharging holes being disposed on a surface of the branch pipe.

In an embodiment of the application, the cabinet further comprises a porous board disposed in the immersion tank, positioned proximate to the branch pipe, and having a plurality of through holes, with the plurality of through holes being more densely distributed than the plurality of discharging holes.

In an embodiment of the application, the immersion tank and the cooling space stand upright and side by side.

In an embodiment of the application, the immersion tank and the cooling mechanism are disposed on two opposing sides of the cooling space, respectively.

In an embodiment of the application, a transparent window is defined on at least part of a side of the cabinet and positioned proximate to the immersion tank.

In an embodiment of the application, the immersion tank opens toward the top surface of the cabinet.

In an embodiment of the application, the single-phase immersion cooling system further comprises an operating interface disposed on the top surface of the cabinet.

In an embodiment of the application, the single-phase immersion cooling system further comprises casters disposed on the bottom surface of the cabinet.

Therefore, the single-phase immersion cooling system of the application operates independently and is easier to install and move, compared with any other cooling system which has to connect to a cooling tower or chiller.

DETAILED DESCRIPTION OF THE INVENTION

Figure 1:
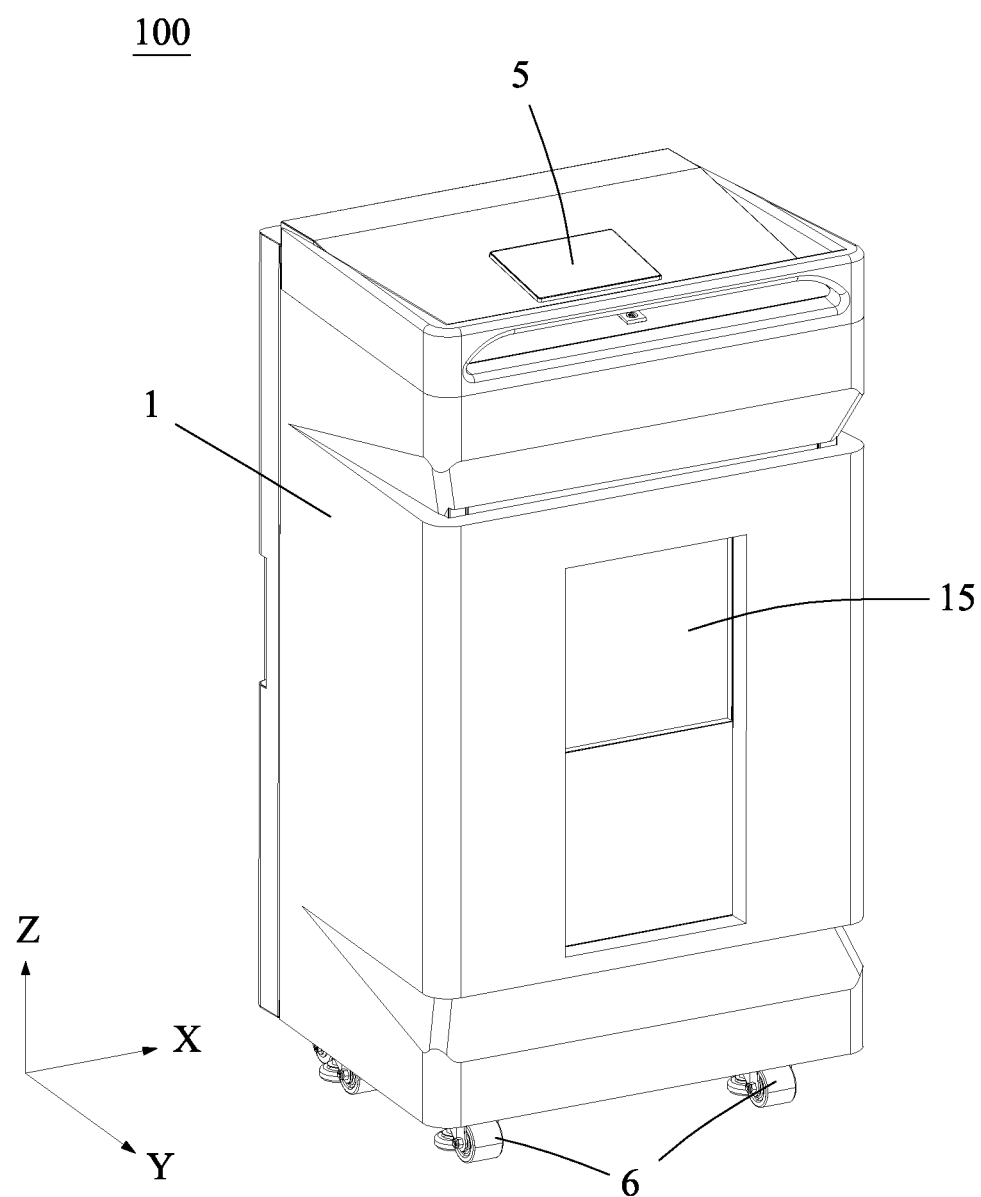
FIG. 1 is a perspective view of a single-phase immersion cooling system according to an embodiment of the application.

The application is hereunder illustrated with specific embodiments, depicted with accompanying drawings, and described in detail below to enable persons skilled in the art to gain insight into the objectives, features, and advantages of the application. The application can be implemented or applied in accordance with any other variant embodiments. Details presented herein may be modified or changed from different perspectives and for different applications without departing from the spirit of the application. The embodiments presented below are further descriptive of the technical features of the application rather than restrictive of the claims of the application.

Referring to FIG. 1 through FIG. 4, an embodiment of the application provides a single-phase immersion cooling system 100 comprising a cabinet 1, a circulation pipeline 2, a driving mechanism 3 and a cooling mechanism 4.

The cabinet 1 has therein a partition board 11 for partitioning a space into an immersion tank 12 and a cooling space 13. In this embodiment, the cabinet 1 is column-shaped. However, the application is not limited thereto. The immersion tank 12 is filled with a cooling liquid. An electronic device to be cooled down, such as a server, is immersed in the cooling liquid. Alternatively, electronic devices are immersed in the cooling liquid in the immersion tank 12.

The circulation pipeline 2 comprises an input segment 21, an output segment 22 and a cooling segment 23. The input segment 21 and output segment 22 penetrate the partition board 11 to input the cooling liquid to the immersion tank 12 and output the cooling liquid, respectively. Considering the convection principle, the input segment 21 is preferably disposed at the bottom of the immersion tank 12, whereas the output segment 22 is preferably disposed at the top of the immersion tank 12. However, the application is not limited thereto. The cooling segment 23 is disposed in the cooling space 13 and is in communication with the input segment 21 and output segment 22. The cooling liquid which has absorbed the heat of the electronic device is transferred with the output segment 22 to the cooling segment 23. After cooling down in the cooling segment 23, the cooling liquid reenters the input segment 21 to achieve closed circulation. The cooling segment 23 comprises a pipeline with a large surface area, for example, a bent pipe or coiled pipe. The cooling liquid in the cooling segment 23 undergoes heat exchange with air in the cooling space 13 and thus cools down.

The driving mechanism 3 is disposed at the cooling segment 23. In this embodiment, for example, the driving mechanism 3 is an electric pump and is in the number of two, such that the driving mechanisms 3 are disposed on the cooling segment 23 to generate the pressure required for the cooling liquid to flow in the aforesaid direction and form a closed circulation loop.

The cooling mechanism 4 is disposed on one side of the cabinet 1 and positioned proximate to the cooling space 13. In this embodiment, the cooling mechanism 4 is a fan for removing the heat from the cooling space 13 to the outside. The cooling mechanism 4 is in a plural number to speed up cooling.

A ventilation opening 1a in communication with the cooling space 13 is formed on at least one lateral side of the cabinet 1 to admit ambient cool air into the cooling space 13 to absorb the heat of the cooling liquid through the cooling segment 23. The air which has absorbed the heat is then carried away by the cooling mechanism 4. According to the application, each of the two lateral sides of the cabinet 1 has the ventilation opening 1a in communication with the cooling space 13.

Thus, the single-phase immersion cooling system 100 of the application operates independently without connecting to any external cooling tower or chiller. Compared with any other cooling system which must connect to a cooling tower or chiller, the single-phase immersion cooling system 100 of the application is easier to install and move.

Figure 5:
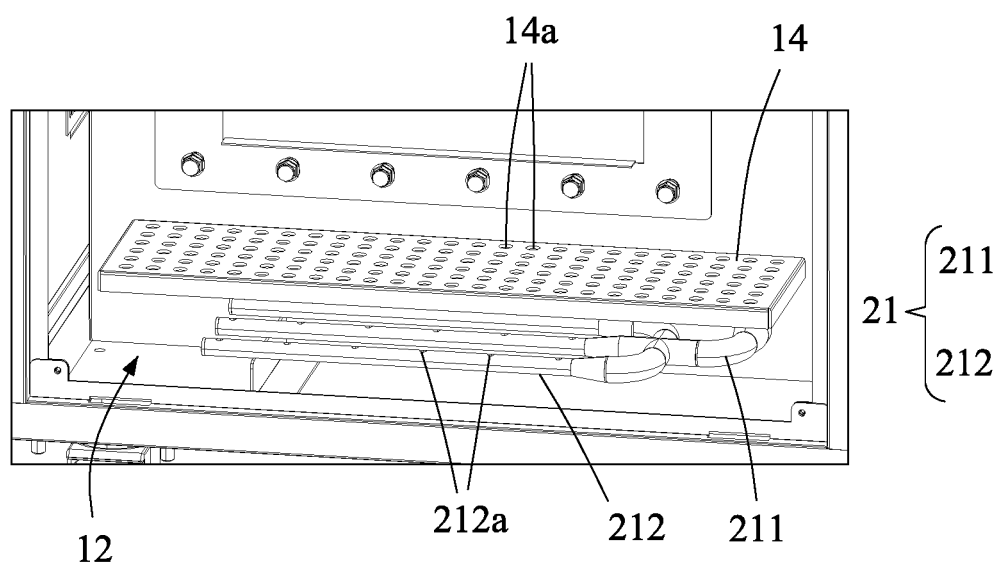
FIG. 5 is a partial enlarged view of the single-phase immersion cooling system according to an embodiment of the application.

In an embodiment illustrated by FIG. 5, the input segment 21 comprises a main pipe 211 and a branch pipe 212. The main pipe 211 penetrates the partition board 11. The branch pipe 212 is in communication with the main pipe 211 and branches out. A plurality of discharging holes 212a are disposed on the surface of the branch pipe 212. The branch pipe 212 and discharging holes 212a allow the cooling liquid to be uniformly released from the input segment 21 into the immersion tank 12.

Furthermore, in this embodiment, the cabinet 1 further comprises a porous board 14 disposed in the immersion tank 12 and positioned proximate to the branch pipe 212. A plurality of through holes 14a are disposed on the porous board 14. The plurality of through holes 14a are more densely distributed than the plurality of discharging holes 212a. The stream of the cooling liquid released from the plurality of discharging holes 212a is further divided by the plurality of through holes 14a.

Figure 2:
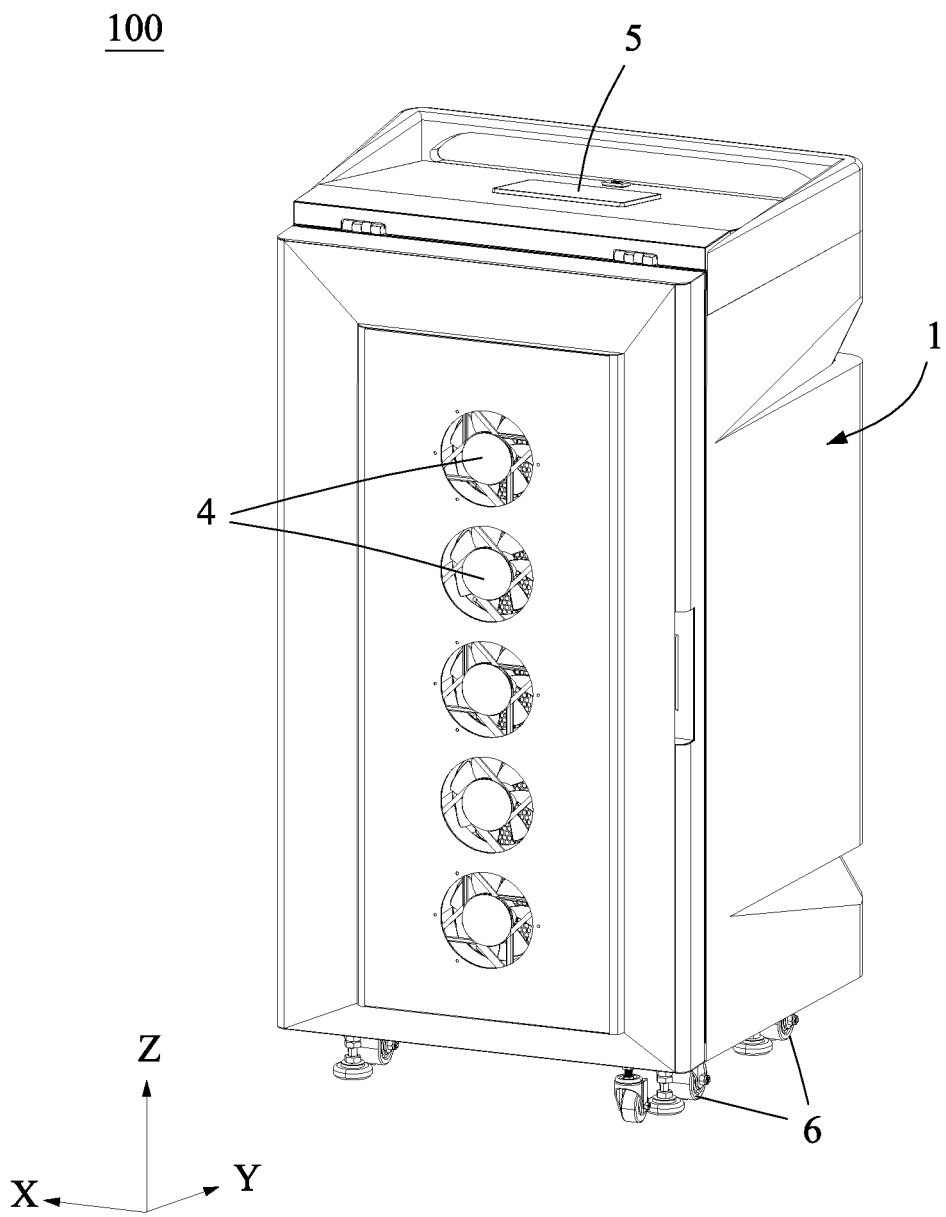
FIG. 2 is a perspective view of the single-phase immersion cooling system taken from another angle according to an embodiment of the application.
Figure 3:
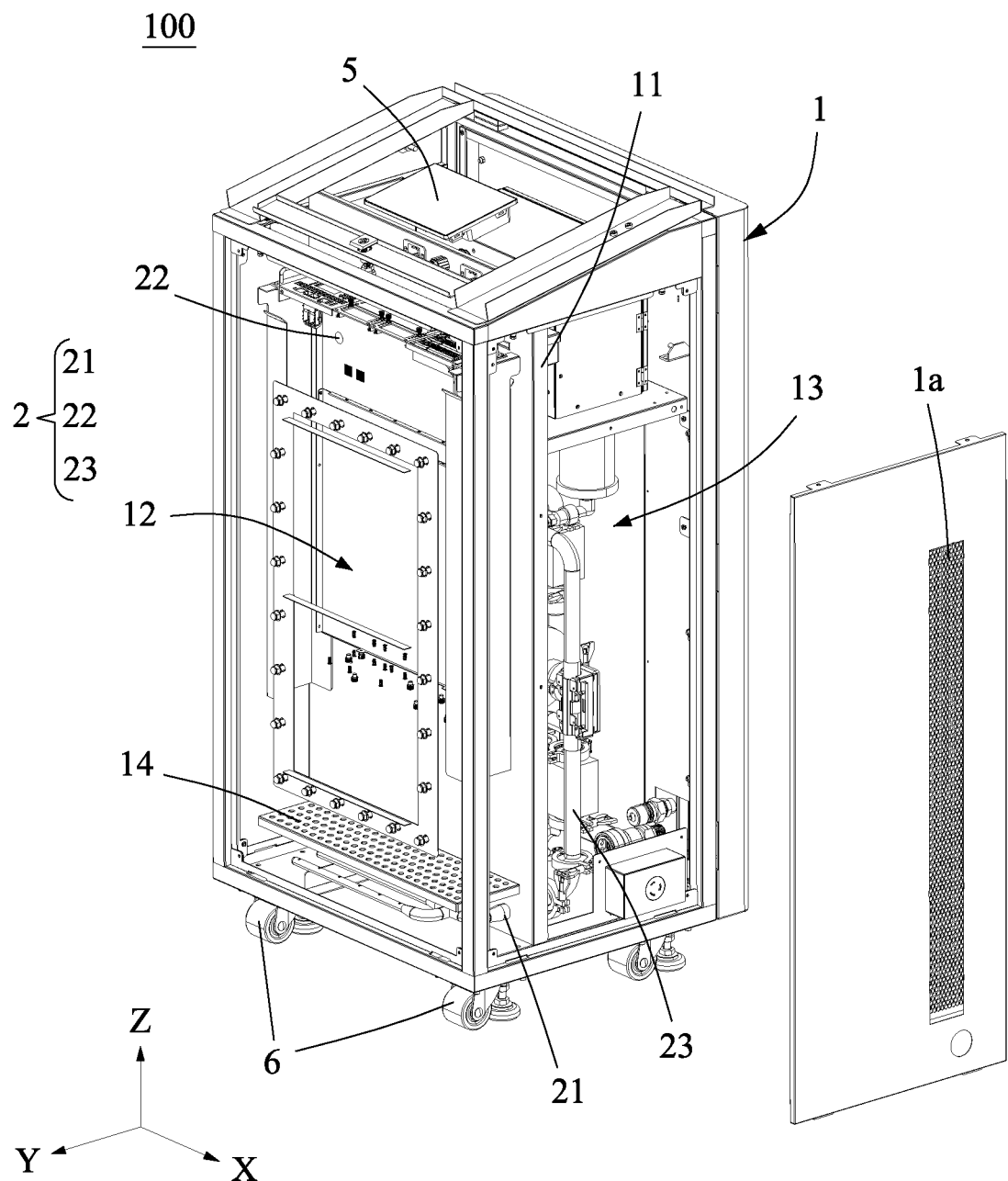
FIG. 3 is a perspective view of the single-phase immersion cooling system according to an embodiment of the application.
Figure 4:
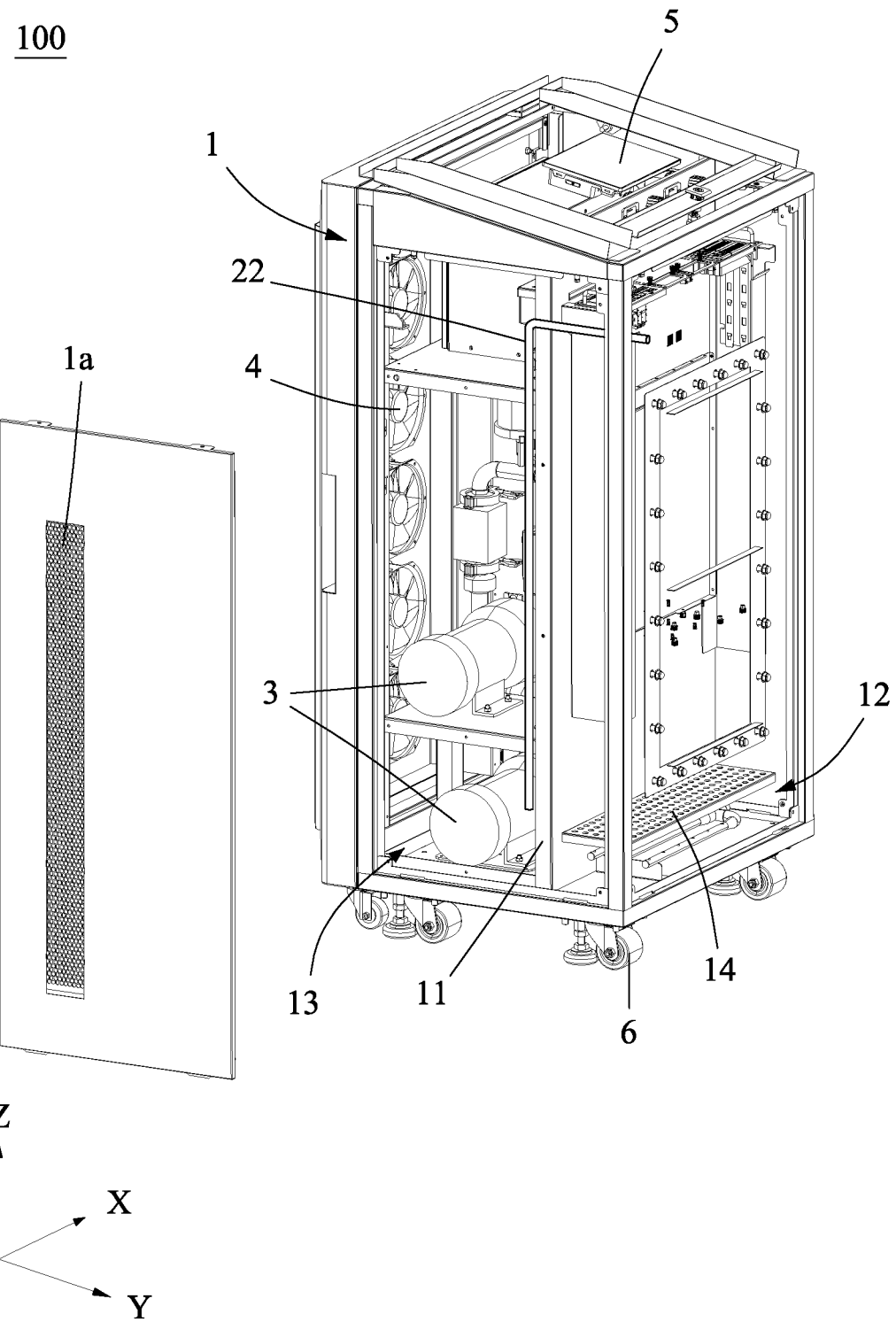
FIG. 4 is a perspective view of the single-phase immersion cooling system taken from another angle according to an embodiment of the application.

Furthermore, in an embodiment illustrated by FIG. 2, the immersion tank 12 and the cooling space 13 stand upright and side by side. However, the application is not limited thereto. The arrangement of the immersion tank 12 and the cooling space 13 in the cabinet 1 is subject to changes.

Furthermore, in an embodiment, the immersion tank 12 and the cooling mechanism 4 are disposed on two opposing sides of the cooling space 13, respectively.

Furthermore, in an embodiment illustrated by FIG. 1, a transparent window 15 is defined on at least part of a side of the cabinet 1 and positioned proximate to the immersion tank 12. Users may watch through the transparent window 15 to evaluate the cooling status in the immersion tank 12.

Furthermore, in an embodiment, the immersion tank 12 opens toward the top surface of the cabinet 1, such that the electronic device is placed under the top surface of the cabinet 1 and mounted inside the immersion tank 12, thereby precluding a liquid leak. However, the application is not limited thereto.

Furthermore, in an embodiment illustrated by FIG. 1 through FIG. 4, the single-phase immersion cooling system 100 further comprises an operating interface disposed on the top surface of the cabinet 1. The operating interface 5 is in signal connection with the driving mechanism 3 and the cooling mechanism 4 to allow users to regulate the operation of the driving mechanism 3 and the cooling mechanism 4.

Furthermore, in an embodiment illustrated by FIG. 1 through FIG. 4, the single-phase immersion cooling system 100 further comprises casters 6 disposed on the bottom surface of the cabinet 1. The casters 6 further enhance the independence of the single-phase immersion cooling system 100 and enable the cabinet 1 to be moved to any place as needed.

The application is disclosed above by embodiments. However, persons skilled in the art should understand that the embodiments are illustrative of the application only, but shall not be interpreted as restrictive of the scope of the application. Hence, all equivalent modifications and replacements made to the aforesaid embodiments shall be deemed falling within the scope of the application. Accordingly, the legal protection for the application shall be defined by the appended claims.

What is claimed is:

1. A single-phase immersion cooling system, comprising:
    a cabinet having therein a partition board for partitioning a space into an immersion tank and a cooling space;
    a circulation pipeline comprising an input segment, an output segment and a cooling segment, with the partition board being penetrated by the input segment and the output segment, and with the cooling segment being disposed in the cooling space and in communication with the input segment and the output segment, wherein the input segment comprises a main pipe and a branch pipe, the main pipe penetrating the partition board, the branch pipe being in communication with the main pipe and branching out, with a plurality of discharging holes being disposed on a surface of the branch pipe;

a driving mechanism disposed at the cooling segment; and a cooling mechanism disposed on a side of the cabinet and positioned proximate to the cooling space, wherein a ventilation opening in communication with the cooling space is formed on at least one lateral side of the cabinet.

2. The single-phase immersion cooling system of claim 1, wherein the cabinet further comprises a porous board disposed in the immersion tank, positioned proximate to the branch pipe, and having a plurality of through holes, with the plurality of through holes being more densely distributed than the plurality of discharging holes.

3. The single-phase immersion cooling system of claim 1, wherein the immersion tank and the cooling space stand upright and side by side.

4. The single-phase immersion cooling system of claim 1, wherein the immersion tank and the cooling mechanism are disposed on two opposing sides of the cooling space, respectively.

5. The single-phase immersion cooling system of claim 1, wherein a transparent window is defined on at least part of a side of the cabinet and positioned proximate to the immersion tank.

6. The single-phase immersion cooling system of claim 1, wherein the immersion tank opens toward a top surface of the cabinet.

7. The single-phase immersion cooling system of claim 1, further comprising an operating interface disposed on a top surface of the cabinet.

8. The single-phase immersion cooling system of claim 1, further comprising casters disposed on a bottom surface of the cabinet.

* * * * *